(12) United States Patent
Kim et al.

(10) Patent No.: US 9,379,886 B2
(45) Date of Patent: Jun. 28, 2016

(54) SAMPLE RATE CONVERTER AND METHOD OF CONVERTING SAMPLE RATE

(71) Applicant: ELECTRONICS AND TELECOMMUNICATIONS RESEARCH INSTITUTE, Daejeon (KR)

(72) Inventors: Sang-Kyun Kim, Daejeon (KR); Mi-Jeong Park, Daejeon (KR); Ik-Soo Eo, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 14/793,645

(22) Filed: Jul. 7, 2015

(65) Prior Publication Data

US 2016/0087787 A1 Mar. 24, 2016

(30) Foreign Application Priority Data

Sep. 19, 2014 (KR) .................. 10-2014-0124737

(51) Int. Cl.
*H04L 7/00* (2006.01)
*H04L 7/04* (2006.01)
(52) U.S. Cl.
CPC ...................... *H04L 7/048* (2013.01)
(58) Field of Classification Search
CPC . H04L 7/048; H03H 17/0628; H03H 17/0621
USPC ................ 375/355, 372, 373; 341/60, 61
See application file for complete search history.

(56) References Cited

U.S. PATENT DOCUMENTS

| 7,339,503 B1* | 3/2008 | Elenes ............... H03H 17/0027 341/60 |
| 2008/0101508 A1 | 5/2008 | Oh et al. |
| 2009/0129450 A1 | 5/2009 | Eum et al. |
| 2013/0002457 A1 | 1/2013 | Tudose |
| 2014/0198830 A1 | 7/2014 | Sen et al. |

FOREIGN PATENT DOCUMENTS

| KR | 10-1998-0052338 A | 9/1998 |
| KR | 10-2014-0092194 A | 7/2014 |
| WO | WO 2012/050267 A1 | 4/2012 |

OTHER PUBLICATIONS

Quang X. Duong et al., "Asynchronous Sampling Rate Conversions in Digital Communications Systems," REV Journal on Electronics and Communications, Jul.-Sep. 2011, pp. 152-159, vol. 1.

* cited by examiner

*Primary Examiner* — Phuong Phu

(57) ABSTRACT

A sample rate converter and a method of converting a sample rate are disclosed herein. The sample rate converter includes a data delay unit, a clock rate conversion unit, a Lagrange polynomial filter unit, a resample position calculation unit, and a resample position compensation unit. The data delay unit delays signals in response to an input clock signal. The clock rate conversion unit converts the sample rate of the signals. The Lagrange polynomial filter unit performs a filtering function on the signals whose rate has been converted. The resample position calculation unit outputs the value (Dint, dfrac) of the resample position of the signals based on a set resample ratio value. The resample position compensation unit corrects the error value of the signals by applying the value (Dint, dfrac) to the signals, and outputs a final signal.

13 Claims, 12 Drawing Sheets

SAMPLE RATE CONVERTER AND METHOD OF CONVERTING SAMPLE RATE

CROSS-REFERENCE TO RELATED APPLICATION

This application claims the benefit of Korean Patent Application No. 10-2014-0124737, filed Sep. 19, 2014, which is hereby incorporated by reference herein in its entirety.

BACKGROUND

1. Technical Field

Embodiments of the present invention relate to a resample ratio error compensation technique for a sample rate conversion algorithm that supports a non-integer rational number multiple resample ratio.

2. Description of the Related Art

In digital signal processing systems, if a radio frequency (RF) band clock has not been synchronized with a baseband clock, a sample rate conversion algorithm is used to change the rate of a signal to a low baseband sampling frequency while maintaining information. In particular, systems supporting various communication standards and frequency bands need to support a non-integer multiple sampling ratio as well as an integer multiple sampling ratio.

As a related sample rate conversion algorithm, there is known an algorithm including L multiple interpolation, a low bandpass filter, and M multiple decimation. Although this sample rate conversion algorithm is the easiest rate conversion method, it is not effective because the complexity of the filter increases if the values L and M are increase.

For this reason, another algorithm that is commonly used is a sample rate conversion method using a fractional delay filter. The fractional delay filter performs correction on a delay equal to or less than 1 clock. The fractional delay filter functions to find and correct the resampling position of output signals when receiving signals sampled at an input sample rate and resampling them at an output sample rate.

Such fractional delay filters chiefly employ a Farrow structure based on a Lagrange polynomial. The reason for this is that fractional delay filters having a Farrow structure are advantageous in that a delay parameter can be controlled because real-time update can be performed and complexity is low compared to a method using a common FIR filter.

$$y(t) = \sum_{i=l_1}^{l_2} C_i x(i), \quad (1)$$

where $$C_i = \prod_{\substack{j=l_2 \\ j \neq i}}^{l_2} \frac{t - t_j}{t_i - t_j}$$

Equation 1 represents a Lagrange polynomial and resampling in the form of an equation. In Equation 1, t does not mean a continuous time t, but is a value obtained by representing the position at which resampling needs to be performed as a relative position within 1 symbol period.

Resampling using the fractional delay filter can produce a required sample rate with respect to any input signal, and thus can be effectively used in systems supporting multiple bands because a required rate can be obtained even if an input/output sample rate is flexible.

However, in a sample rate conversion algorithm used for resampling in a structure in which two asynchronous clocks operate at the same time, the resampling using a fractional delay filter causes the deterioration of performance because problems, such as metastability, a phase offset, and a clock rate error, occur.

In order to overcome the problems occurring in asynchronous clocks, a data conversion method using memory was proposed. If the data conversion method using memory is used, the problem of a phase offset can be solved and the problem of metastability can be reduced by safely converting signals using memory without the direct exchange of data between two clock domains upon converting the sample rate of input data.

However, there still remains the problem in which an error occurs between an externally input resample ratio and an actual operating clock rate.

Korean Patent Application Publication No. 1998-0052338 (published on Sep. 25, 1998 and entitled "Apparatus for Correcting Delay Error of Clock Phase Shifter") discloses an apparatus for correcting the delay error of a clock phase shifter. In particular, there is disclosed the feature of determining the amount of desired phase shift of clocks through the measurement of the amount of shift attributable to a reduction in the delay of a gate and correcting a delay error attributable to voltage, temperature, and processing errors, thereby achieving a stabilized phase shift.

However, the related art does not discloses a feature in which an accurate resampling position is found by compensating for the error of a resample ratio input to a fractional delay filter in a sample rate conversion algorithm that supports a fractional resample ratio and uses asynchronous clocks.

SUMMARY

At least some embodiments of the present invention are directed to the provision of an apparatus and method for implementing an algorithm, which are capable of finding an accurate resampling position by compensating for the error of a resample ratio input to a fractional delay filter in a sample rate conversion algorithm that supports a fractional resample ratio and uses asynchronous clocks.

In accordance with an aspect of the present invention, there is provided a sample rate converter, including: a data delay unit configured to delay signals in response to an input clock signal; a clock rate conversion unit configured to convert the sample rate of the signals; a Lagrange polynomial filter unit configured to perform a filtering function on the signals whose rate has been converted; a resample position calculation unit configured to output the value (Dint, dfrac) of the resample position of the signals based on a set resample ratio value; and a resample position compensation unit configured to correct the error value of the signals generated due to non-integer multiple sample rate conversion by applying the value (Dint, dfrac) of the resample position to the signals, and to output a final signal; wherein the value of the resample position includes an integer value Dint and a factional value dfrac.

The clock rate conversion unit may include memory, may sequentially store the input signals, sampled at an input clock rate, in the memory, and may sample the signals, stored in the corresponding memory, at an output clock rate by using the integer value Dint of the resample position, output by the resample position calculation unit, as the address of an address of the corresponding memory.

The order of a filter of the Lagrange polynomial filter unit may be variably applied depending on a resample rate and a bandwidth; and the coefficient of the filter may be determined by the order.

The delay order of the data delay unit may be determined by the order of a filter of the Lagrange polynomial filter unit, and the signals may be delayed by 1 sample in response to the input clock.

The resample position calculation unit may output the value of the resample position used to estimate the resample position based on the value of the resample ratio indicative of the ratio of the input clock to an output clock.

The resample position calculation unit may include: a resample ratio error compensation unit configured to estimate an error between a received resample ratio and an actual operation clock ratio, to update the resample ratio value, and to compensate for a cumulative error corresponding to the updated resample ratio value; and a resample rate calculation unit configured to receive a value estimated by the resample ratio error compensation unit, and to output the value of the resample position in accordance with an output sample rate.

The resample ratio error compensation unit may include: a resample ratio error estimation unit configured to estimate the error between the received resample ratio and the actual operation clock ratio; and a computation error compensation unit configured to correct the cumulative error value that is generated due to a previous resample ratio value as the resample ratio value is updated.

If a change point of data generated due to the integer value Dint of the value of the resample position is not equal to a change point of data generated between actual clocks, the resample ratio error estimation unit may determine that an error is present in a received resample ratio, and update the value of a factional ratio part of the resample ratio.

The resample ratio error estimation unit may include: a clock count block configured to output a signal, counted using the input clock, as an output clock Cclk(m); computation and pulse generation blocks configured to compare the output clock Cclk(m) of the clock count block and a value D(m) of the integer value Dint of the value of the resample position of the clock in the corresponding clock with an output clock Cclk(m−1) of a previous clock and an integer value D(m−1) of a value of a resample position of the previous clock, to determine whether each of differences Cclk(m)-Cclk(m−1) and D(m)-D(m−1) is equal to a value T predetermined in accordance with the resample ratio, to determine that loss points has been generated due to accumulation of a factional ratio part if the difference is not equal to the predetermined value T, and to generate pulses; pulse count blocks configured to calculate a pulse occurrence interval of the pulses; a comparison block configured to compare a pulse generated by the integer value Dint of the value of the resample position with the pulse generated by an operation of an actual clock, and to determine an operating rate of the integer value Dint of the received value of the resample position; and an update block configured to receive an operating state of the integer value Dint of the value of the resample position, and to output a value FracRate_comp obtained by updating the resample ratio value with a correction unit value Comp_Fdelay.

The computation error compensation unit may include: a counter unit configured to output the count value of a section, calculated using a previous ratio, whenever the value FracRate_comp obtained by updating the resample ratio value with the correction unit value Comp_Fdelay is updated; and an accumulation unit configured to calculate the error compensation value of the section, calculated using the previous ratio, using the value, output by the counter unit, and the correction unit value Comp_Fdelay.

In accordance with another aspect of the present invention, there is provided a method of converting a sample rate, including: sequentially storing input signals, sampled at an input clock rate, in the memory of a clock rate conversion unit; outputting, by a resample position calculation unit, the value of the resample position of the signals based on a set resample ratio value; sampling, by a clock rate conversion unit, the signals stored in the corresponding memory at an output clock rate by using an integer value Dint of the resample position as an address of the corresponding memory; and correcting, by a resample position compensation unit, the error value of the signals attributable to non-integer multiple sample rate conversion by applying the value of the resample position to the signals.

The value of the resample position may include the integer value Dint corresponding to an integer part and a factional value dfrac corresponding to a fractional part.

Sampling, by the clock rate conversion unit, the signals stored in the corresponding memory at the output clock rate by using the integer value Dint of the resample position as the address of the corresponding memory may include: sequentially storing, by the clock rate conversion unit, the input signals, sampled at the input clock rate, in the memory; and sampling the signals, stored in the corresponding memory, at the output clock rate by using an integer value of the resample position calculated by the resample position calculation unit as the address of the corresponding memory address.

Correcting, by the resample position compensation unit, the error value of the signal attributable to the non-integer multiple sample rate conversion by applying the value of the resample position to the signal may include minimizing the influence of a phase offset generated between asynchronous clocks by predicting the location of the memory in which the signals to be sampled are stored and the resample position of the signal through the calculation of the cumulative value of a received resample ratio.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
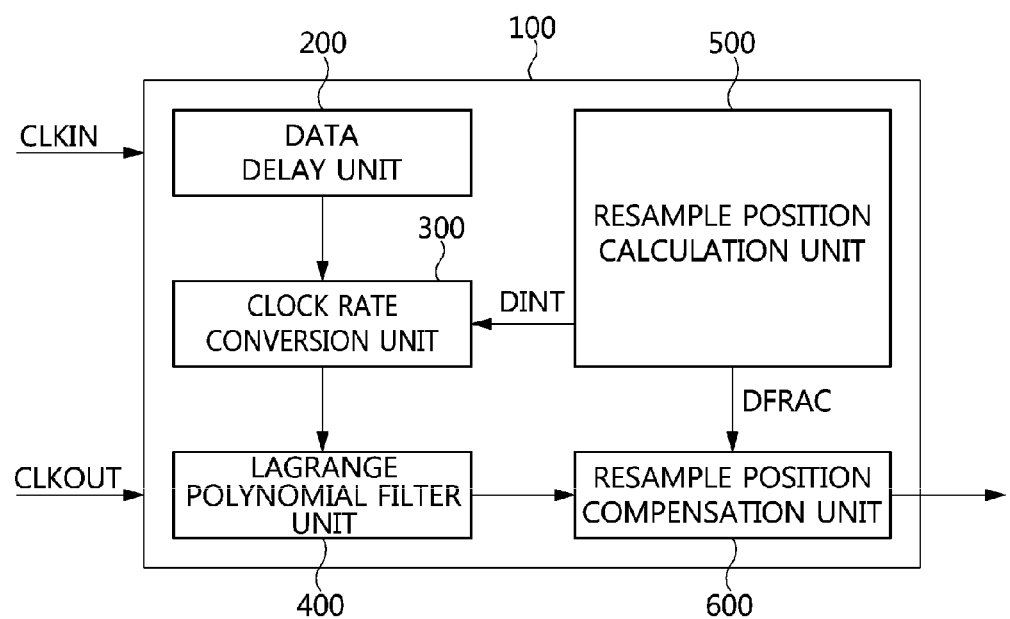
FIG. 1 is a diagram illustrating the schematic configuration of a sample rate converter according to an embodiment of the present invention.

The present invention may be subjected to various modifications and have various embodiments. Specific embodiments are illustrated in the drawings and described in detail below. However, it should be understood that the present invention is not intended to be limited to these specific embodiments but is intended to encompass all modifications, equivalents and substitutions that fall within the technical spirit and scope of the present invention.

The terms used herein are used merely to describe embodiments, and not to limit the inventive concept. A singular form may include a plural form, unless otherwise defined.

In an embodiment of the present invention, the configuration of a sample rate converter 100 for converting the sample rate of signals in a digital signal processing system using asynchronous clocks is described below.

The sample rate converter 100 based on a fractional delay filter resamples input signals, sampled at an input clock rate, into signals at an output clock rate, and outputs the resampled signals.

Equation 2 below represents a delay value that is calculated by the fractional delay filter. The value (Dint, dfrac) of the resample position of the signals indicates the relative position of an n-th output signal with respect to the input signals. The resample position of the output signals is determined based on the value (Dint, dfrac) of the resample position.

The value (Dint, dfrac) of the resample position of the signals includes the integer value Dint and the factional value dfrac.

The integer value Dint is the integer value of the output signals corresponding to the input signals, and is used to select a signal output from memory.

The fractional value dfrac is the value of the 1 clock or less delay of the output signals corresponding to the input signals. Furthermore, the fractional value dfrac is a value that represents the position at which resampling needs to be performed as a relative position within 1 symbol period and that is used for the fractional delay filter to find a resampling position.

$$D[n] = D_{int}[n] + d_{frac}[n] \quad (2)$$

A resampling algorithm that is used in an embodiment of the present invention has a structure using a fractional delay filter based on a Farrow structure. Memory was used in order to stably convert the rate of a signal between asynchronous clocks, and a block for compensating for the error of a non-integer resample ratio has been implemented.

In the following description, although the sample rate converter 100 that operates when down sampling is performed in a digital signal processing system is described as an example, it may be applied to an up sampling process in the same manner.

Embodiments of the present invention are described in detail below with reference to the accompanying drawings.

FIG. 1 is a diagram illustrating the schematic configuration of the sample rate converter 100 according to an embodiment of the present invention.

The sample rate converter 100 according to the present embodiment functions to convert signals, sampled at a set input clock rate, into signals at an output clock rate, to estimate the resampling position of the signals whose rate has been converted based on a set resample ratio value, and to output resampled signals in accordance with an output clock.

The input/output clock rates of the sample rate converter 100 described in the present embodiment have values equal to or larger than those of the sample rates of input/output signals. In contrast, the input/output clock rates of a sample rate converter that performs up sampling have values equal to or smaller than those of the sample rates of input/output signals.

If a clock rate is equal to the sample rate of signals, the signals operate at the clock rate. If a clock rate is higher than the sample rate of signals, an operation is performed in response to an enable signal corresponding to the sample rate of the signals.

In the present embodiment, it is assumed that the sample rate of signals is equal to a clock rate.

Referring to FIG. 1, the sample rate converter 100 according to the present embodiment includes a data delay unit 200, a clock rate conversion unit 300, a Lagrange polynomial filter unit 400, a resample position calculation unit 500, and a resample position compensation unit 600.

The data delay unit 200 delays signals by 1 sample in response to an input clock CLKIN, and outputs the delayed signals. The delay order of the data delay unit 200 is determined by the filter order of the Lagrange polynomial filter unit 400.

The clock rate conversion unit 300 functions to convert the sample rate of signals.

The clock rate conversion unit 300 functions to convert the sample rate of signals from an input operating frequency to an output operating frequency. That is, the clock rate conversion unit 300 is a component in which an input clock and an output clock that are not synchronized operate at the same time. The clock rate conversion unit 300 functions to stably convert the sample rate of signals into the sample rate of an output clock using memory.

For this purpose, the clock rate conversion unit 300 includes memory.

The clock rate conversion unit 300 sequentially stores input signals, sampled at an input clock rate, in the memory, and samples the signals, stored in the corresponding memory, at an output clock rate by using the integer value of a resample position, calculated by the resample position calculation unit 500, as a memory address.

The Lagrange polynomial filter unit 400 functions to filter the signals whose rate has been converted.

In this case, the order of the Lagrange polynomial filter of the Lagrange polynomial filter unit 400 may be variably applied depending on a resample rate and a bandwidth. The coefficient of the Lagrange polynomial filter is determined by the order.

The resample position calculation unit 500 outputs the value (Dint, dfrac) of the resample position of signals based on a set resample ratio value.

In this case, the value of the resample position includes the integer value Dint of an integer part and the factional value dfrac of a fractional part.

The resample ratio is a value that is indicative of the ratio of input/output clocks Fclkin/Fclkout. The signals stored in the memory are output based on the resample ratio, and the integer value Dint and the fraction value dfrac used to estimate the resample position are output.

The resample position compensation unit 600 corrects the error value of the signals, generated through non-integer multiple sample rate conversion, by applying the fractional value dfrac, i.e., the fractional part of the estimated value of the resample position of the signals, to the signals.

Figure 2:
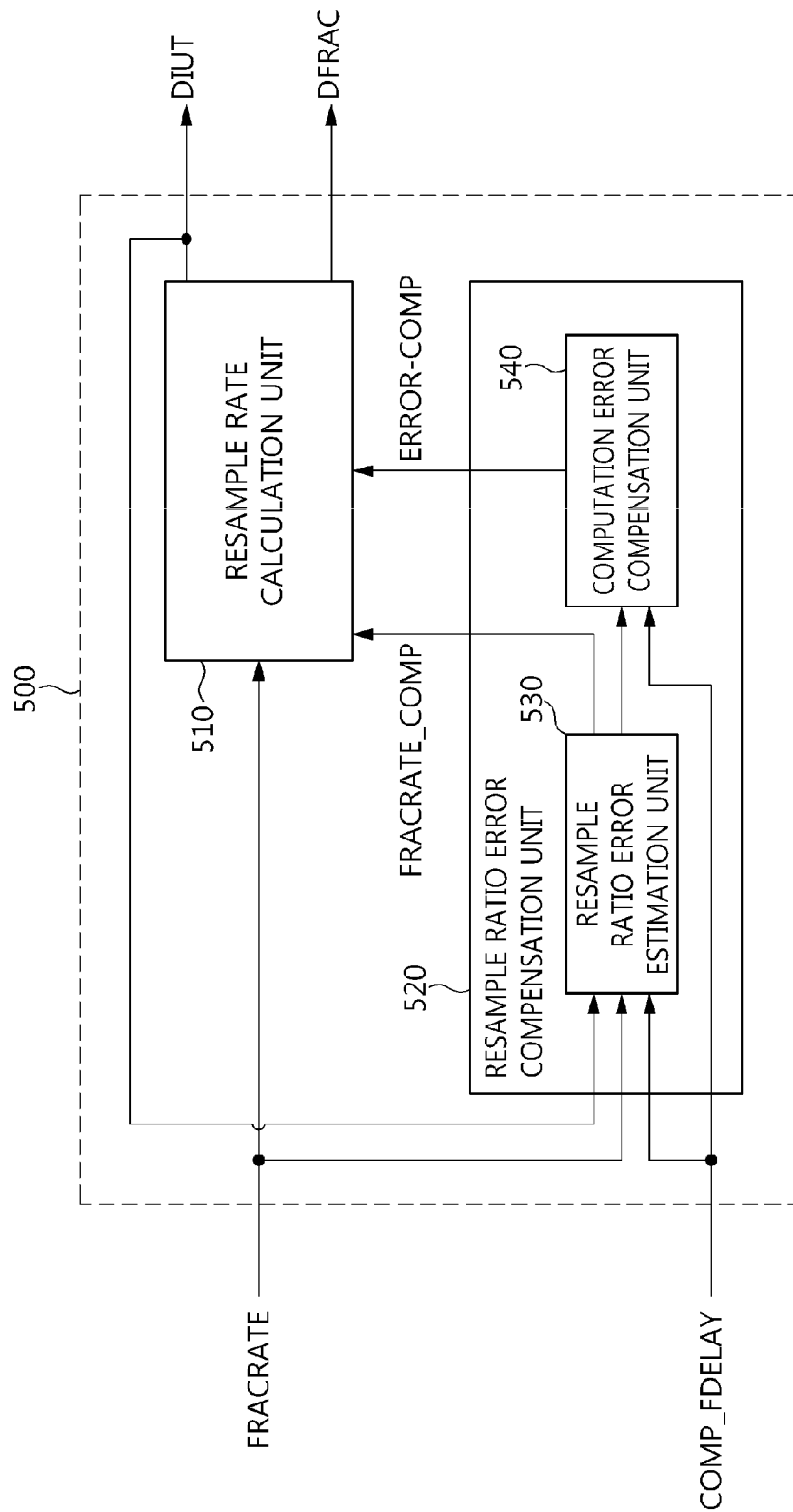
FIG. 2 is a diagram illustrating the detailed configuration of a resample position calculation unit according to an embodiment of the present invention.

FIG. 2 is a diagram illustrating the detailed configuration of the resample position calculation unit 500 according to an embodiment of the present invention.

The resample position calculation unit 500 includes a resample rate calculation unit 510, and a resample ratio error compensation unit 520.

The resample rate calculation unit 510 receives a value, estimated by the resample ratio error compensation unit 520, as input, and outputs the value (Dint, dfrac) of the resample position in accordance with an output sample rate.

The resample ratio error compensation unit 520 functions to estimate an error between a received resample ratio and an actual operation clock ratio, to perform update, and to compensate for a cumulative error occurring due to the update.

The resample ratio error compensation unit 520 includes a resample ratio error estimation unit 530, and a computation error compensation unit 540.

As illustrated in FIG. 2, FracRate input to the resample position calculation unit 500 is indicative of an initially received resample ratio value, and Comp_Fdelay is a unit value used to correct the error of a resample ratio.

The computation error compensation unit 540 calculates and corrects the cumulative error value (which is generated as a resample ratio is updated) of an accumulator that has operated at a previous resample ratio.

Figure 3:
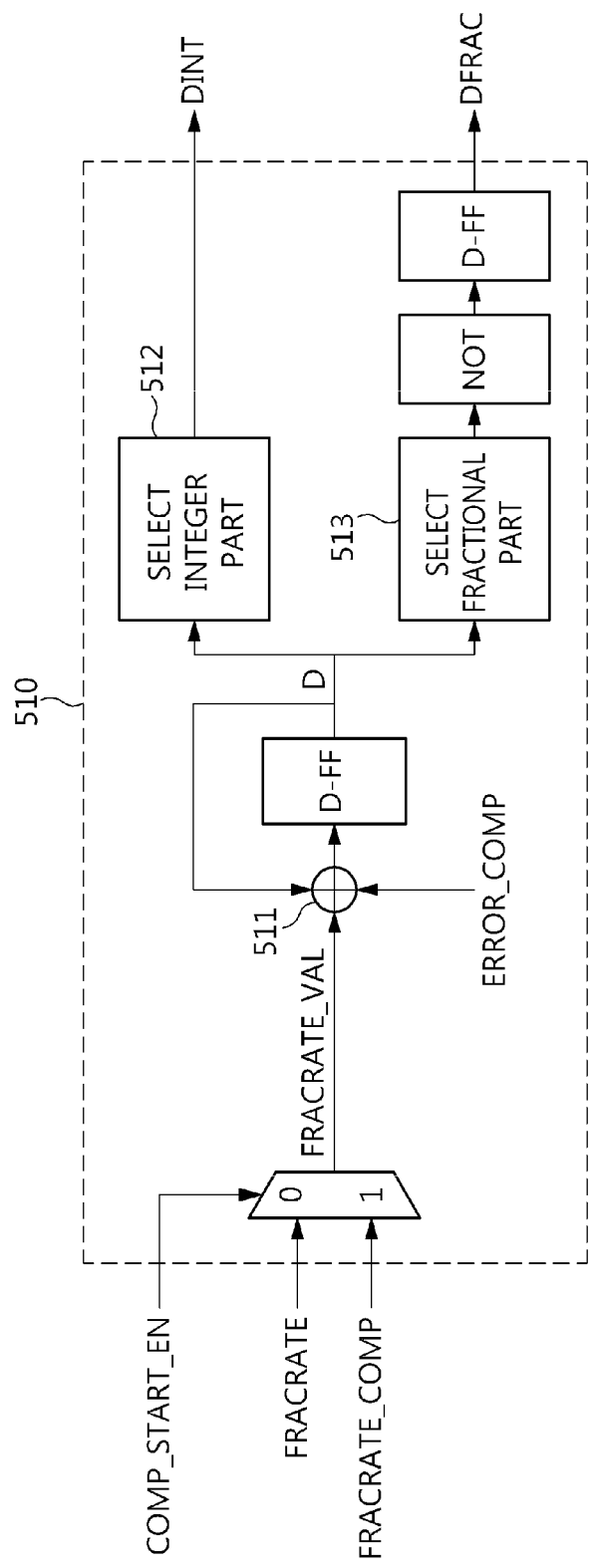
FIG. 3 is a diagram illustrating the detailed configuration of a resample rate calculation unit according to an embodiment of the present invention.

FIG. 3 is a diagram illustrating the detailed configuration of the resample rate calculation unit 510 according to an embodiment of the present invention.

The resample rate calculation unit 510 receives an estimated rate value and the compensation value of a cumulative error from the resample ratio error compensation unit 520 as input, and estimates the value (Dint, dfrac) of the resample position of output signals via an accumulator 511.

One of FracRate, i.e., the resample ratio value initially input to the resample rate calculation unit 510, and the value FracRate_comp, received from the resample ratio error estimation unit 530, is selected in response to the signal Comp_start_EN.

Thereafter, the selected value is added to a previous value via the accumulator 511. Error_comp, i.e., another input value of the accumulator 511, is received from the computation error compensation unit 540, is generated whenever the value FracRate_comp is updated, and is added to the accumulator 511.

The result value D of the accumulator 511 is divided into Dint, i.e., an integer part, and dfrac, i.e., a fractional part.

The integer part Dint is input to the clock rate conversion unit 300, and is used as the address value of the memory in which signals to be output are stored. The fractional part dfrac is a fractional delay value corresponding to a signal selected from the memory, and is multiplied by the output signal of the Lagrange polynomial filter unit 400, thereby functioning to compensate for the resample position of the final output signal.

The reasons why an error occurs in a resample ratio input value may include 1) a case where an erroneous value is initially received, 2) a case where an offset is present in an actual operation clock, and 3) a case where an error occurs due to bit truncation.

If an erroneous resample ratio value is input to the resample position calculation unit 500, an error value is accumulated as the accumulator 511 operates, thereby having a higher influence on signals.

An embodiment of the present invention proposes a method of estimating and correcting the error of a resample ratio which may occur in the sample rate converter 100. In order to estimate the error of a resample ratio, the loss point of data, generated due to the conversion of a sample rate, or an insertion point is used.

That is, a loss point is used in a decimation situation, and an insertion point is used in an interpolation situation.

Although in the following description, an error attributable to a non-integer resample ratio is corrected using a loss point while taking a decimation situation as an example, an error occurring in an interpolation situation may be corrected through the same application using an insertion point.

Figure 4:
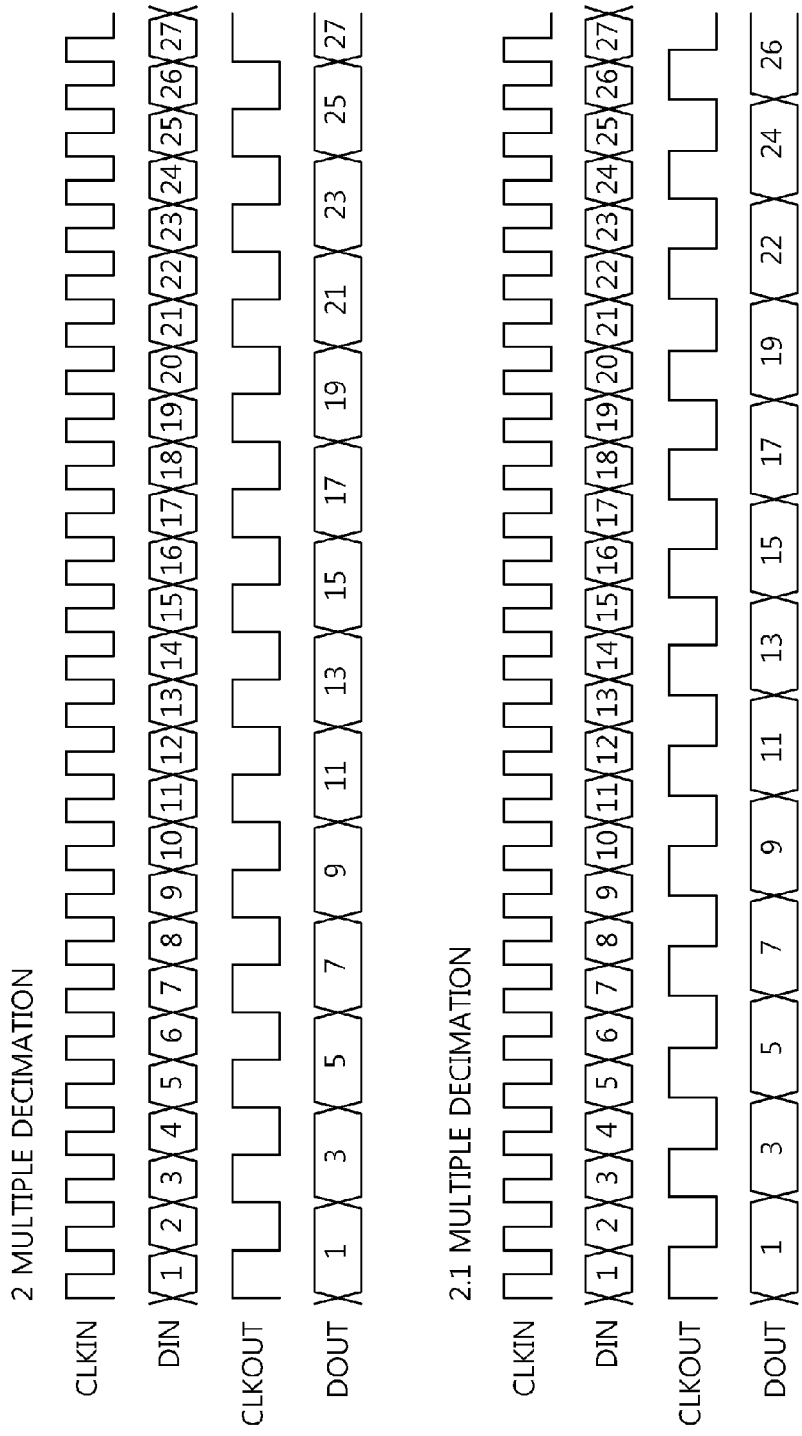
FIG. 4 is a diagram illustrating loss points generated due to the conversion of a sample rate by comparing a 2 multiple decimation process and a 2.1 multiple decimation process according to an embodiment of the present invention.

FIG. 4 is a diagram illustrating loss points generated due to the conversion of a sample rate by comparing a 2 multiple decimation process and a 2.1 multiple decimation process according to an embodiment of the present invention.

In this case, a loss point refers to a change point generated in a decimation situation. In the case of an interpolation situation, a change point is an insertion point.

If 2 multiple decimation is performed, one of two input signals is selected as an output signal. If 2.1 multiple decimation is performed, one of two input signals is selected as an output signal, and then a section in which one of three input signals is selected as an output signal due to a cumulative fractional part value occurs.

In FIG. 4, assuming that an output clock is m when 2 multiple decimation is performed, Dout(m)-Dout(m−1) is always 2, which is constant.

If 2.1 multiple decimation is performed, the value of Dout (m)-Dout(m−1) is constantly 2, and then Dout(m)-Dout(m−1)=3 when an eleventh output clock operates.

The reason for this is that the point of time at which a cumulative fractional part value exceeds 1 arrives. In a decimation process having a fractional ratio, such a point of time always arrives. In an embodiment of the present invention, the point of time is referred to as the loss point of a signal. The error of a resample ratio is estimated using the value.

In an embodiment of the present invention, new loss points generated due to the cumulative values of respective fractional parts in an actual clock ratio and a resample ratio are compared as described above. Furthermore, the loss point of a signal attributable to a fractional part is generated earlier if a resample ratio is higher than an actual clock ratio, and a loss point is generated later if a resample ratio is smaller than an actual clock ratio. Accordingly, the value of the resample ratio is updated such that the loss point of the resample ratio becomes equal to that of the actual clock ratio based on the principle.

Figure 5:
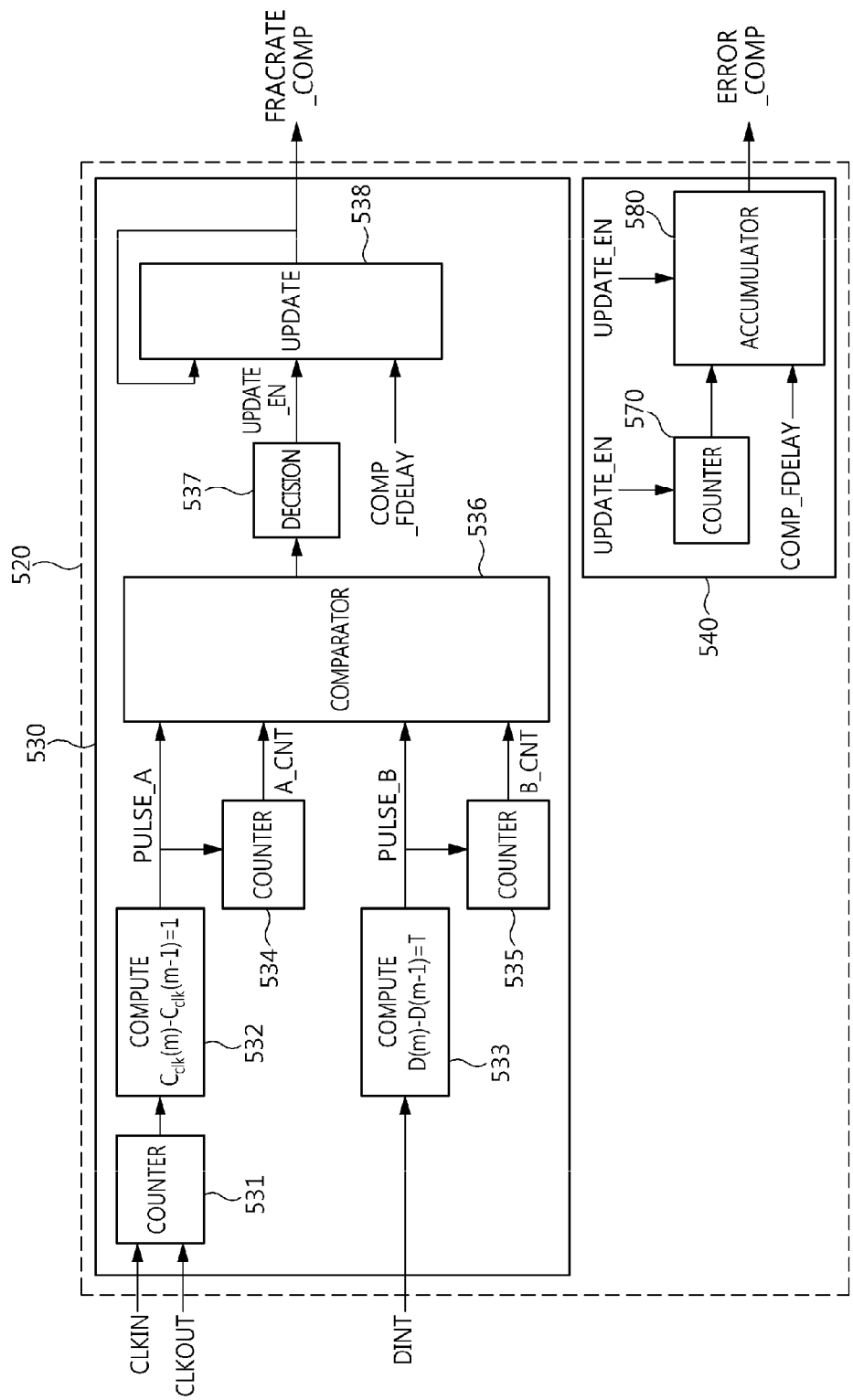
FIG. 5 is a diagram illustrating the detailed configuration of a resample ratio error compensation unit according to an embodiment of the present invention.

FIG. 5 is a diagram illustrating the detailed configuration of the resample ratio error compensation unit 520 according to an embodiment of the present invention.

Although in an embodiment of the present invention, a method of estimating the error of a resample ratio using the loss point of data has been described because a sample rate conversion algorithm upon down sampling is taken as an example, the same process may be performed using the insertion point of data upon up sampling.

The resample ratio error compensation unit 520 includes the resample ratio error estimation unit 530, and the computation error compensation unit 540.

The resample ratio error estimation unit 530 functions to estimate an error between a received resample ratio and an actual operation clock ratio.

If the loss point of data attributable to a value Dint is not equal to that of data actually generated between two clocks, the resample ratio error estimation unit 530 determines that an error is present in a received resample ratio, and updates the fractional rate part value of the resample ratio.

When the loss points of a clock count and the integer part Dint of the cumulative value of the resample ratio are generated, pulses are generated. If the occurrence interval of pulses generated due to the integer part Dint becomes faster based on a pulse value generated due to a clock, it may be estimated that a resample ratio higher than an actual clock ratio has been received. In contrast, if the occurrence interval becomes slower, it may be estimated that a resample ratio lower than an actual clock ratio has been received.

A current resample ratio is updated by adding a predetermined compensation value to the resample ratio or by subtracting the predetermined compensation value from the resample ratio based on the result of the estimation. The error is reduced by repeating such an operation until there is no difference between pulse occurrence intervals.

Making a resample ratio equal to an actual clock ratio is limited due to a problem, such as bit resolution. Accordingly, it is important to minimize the error by estimating a resample ratio so that resample ratio become maximally close to an actual clock ratio.

In an embodiment of the present invention, a resample ratio having a minimum error may be estimated by controlling a unit compensation value received to minutely correct the error value of the resample ratio.

The resample ratio error estimation unit 530 includes a clock count block 531, computation and pulse generation blocks 532 and 533, pulse count blocks 534 and 535, a comparison block 536, and an update block 538.

The clock count block 531 is used to find the loss point of signals based on an actual clock ratio, and outputs a signal, counted using an input clock, as an output clock Cclk(m).

The computation and pulse generation blocks 532 and 533 include a block 532 configured to determine whether Cclk(m)-Cclk(m−1) is equal to the value T preset in response to a resample ratio by comparing the output value Cclk(m) of the clock count block 531 with a previous Cclk(m−1), and a block 533 configured to determine whether D(m)-D(m−1) is equal to the value T preset in response to the resample ratio by comparing D(m), i.e., a value Dint fed back by the accumulator 511, with the previous value D(m−1).

If, as a result of the comparison, each comparison value is not equal to the value T, the computation and pulse generation blocks 532 and 533 determine that loss points have been generated due to the accumulator of a fractional part, and generates a pulse Pulse_A or Pulse_B.

The pulse count blocks 534 and 535 function to calculate a pulse occurrence interval and to calculate an interval between the point of time at which a previous pulse was generated and the point of time at which a subsequent pulse is generated. Whether an error is present between an actual clock ratio and a resample ratio may be determined based on the interval.

Whether the input value Dint operates fast or slow may be determined by comparing a pulse, generated due to the input value Dint, with a pulse generated due to the operation of an actual clock by using the pulses and the pulse interval value obtained through such a process.

The update block 538 receives the state (fast/slow) of the value Dint, updates the value Dint by Comp_Fdelay, i.e., an error correction unit value at which the value of a resample ratio is received (as a + or − value), and outputs a parameter value called FracRate_comp.

The update is repeated until the loss point of an actual clock ratio becomes equal to that of a current resample ratio. If the value of the state is changed from 0 to a value having directivity different from previous directivity, the update block 538 determines that the current error value of a resample ratio is smaller than the error correction unit value Comp_Fdelay, and reduces the value of the error correction unit value Comp_Fdelay.

The ratio of an actual operation clock to the resample ratio of a minimum error may be estimated by repeating such a process.

Figure 6:
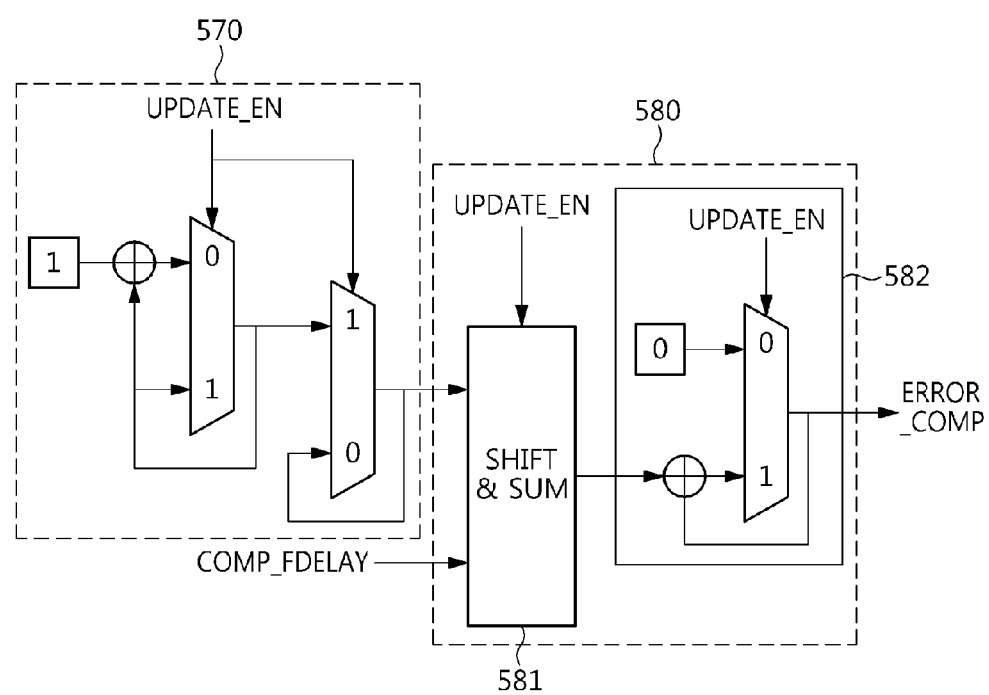
FIG. 6 is a diagram illustrating the detailed configuration of a computation error compensation unit according to an embodiment of the present invention.

FIG. 6 is a diagram illustrating the detailed configuration of the computation error compensation unit 540 according to an embodiment of the present invention.

The computation error compensation unit 540 functions to calculate and correct the error value of the cumulative value of previous resample positions that is generated as the value FracRate_comp is updated.

A resample position is a value that represents the position at which resampling needs to be performed as a relative position within 1 symbol period. Accordingly, the resample position is influenced by a previous value because it is estimated based on the cumulative value of resample ratios. If a value including an error is accumulated, the erroneous value of a resample position is output because the result value of the cumulative value includes an error.

Although a resample ratio equal to an actual clock ratio is found through an error estimation process, the accuracy of a relative position between the resample position of a previous signal and the resample position of a current signal is improved, but the absolute value of the resample position of a current output signal still includes an error due to a previous cumulative error value.

In order to overcome the problem, the computation error compensation unit 540 corrects the cumulative error value of a resample position by updating the cumulative value of the error of a previous resample ratio whenever the value of a resample ratio is updated.

The computation error compensation unit 540 includes a counter unit 570, and an accumulation unit 580.

The counter unit 570 functions to count a section, calculated using a previous ratio, whenever the value FracRate_comp is updated. The counter unit 570 starts to count from the point of time at which a value (m−1)-th FracRate_comp is updated, and sends a count value, calculated at the point of time at which a value m-th FracRate_comp is updated, to the shift∑ block 581 of the accumulation unit 580.

The accumulation unit 580 calculates an error compensation value of a section, calculated using a previous ratio, using the value calculated by the count unit 570 and the correction unit value Comp_Fdelay.

The shift∑ block 581 calculates and compensates for the cumulative error value of a section calculated as the (m−1)-th FracRate_comp using the calculated count value and the correction unit value Comp_Fdelay.

The cumulative error value may be calculated by multiplying the count value and the correction unit value Comp_Fdelay, but a method of dividing a received count value by each $2^n$ and shifting the correction unit value Comp_Fdelay for each corresponding value is used. Accordingly, computational complexity can be reduced using only a shifter and an adder without a multiplier.

An accumulation block 582 functions to calculate the cumulative error value of the section calculated as the value (m−1)-th FracRate_comp from the point of time at which the computation error compensation unit 540 starts to operate based on the cumulative value of calculated error values.

The output value Error_comp of the accumulation block 582 is input to the resample calculation unit 510, and is added in the accumulator. Accordingly, the result value of the addition has the same output value as the value calculated as the value m-th FracRate_comp from the point of time at which the operation of the resample calculation unit 510 starts up to now.

Figure 7:
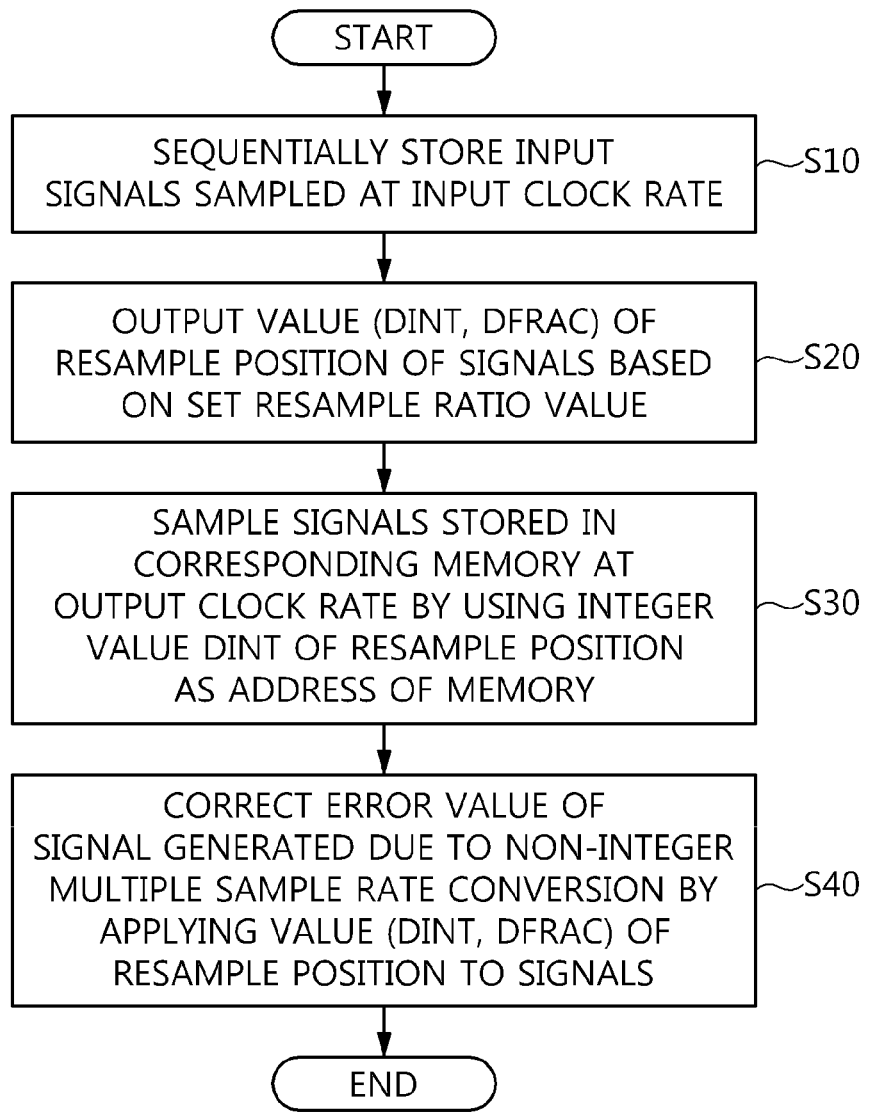
FIG. 7 is a flowchart illustrating a method of converting a sample rate according to an embodiment of the present invention.

FIG. 7 is a flowchart illustrating a method of converting a sample rate according to an embodiment of the present invention.

At step S10, input signals sampled at an input clock rate are sequentially stored in the memory of the clock rate conversion unit 300.

At step S20, the resample position calculation unit 500 outputs the value of the resample position of signals based on a set resample ratio value.

In this case, the value of the resample position may be divided into the integer value Dint, i.e., an integer part, and the factional value dfrac, i.e., a fractional part.

At step S30, the clock rate conversion unit 300 samples the signals stored in corresponding memory at an output clock rate by using the integer value Dint of the resample position as the address of the memory.

As described above, the clock rate conversion unit 300 functions to convert the sample rate of signals from an input operating frequency to an output operating frequency. The clock rate conversion unit 300 functions to stably convert the sample rate of signals into the sample rate of an output clock using the corresponding memory.

The clock rate conversion unit 300 sequentially stores the input signals, sampled at the input clock rate, in the memory, and samples the signals, stored in the corresponding memory, at the output clock rate by using the integer value of the resample position, calculated by the resample position calculation unit 500, as the address of the corresponding memory.

In this case, in an embodiment of the present invention, the memory is ring-type memory. Assuming the size of the memory is N, a single signal is maintained in a single piece of memory during N input clocks.

For example, if an m-th signal is input to No. 0 memory at an L-th input clock, the m-th signal is stored in the No. 0 memory during N input clocks. When an (L+N)-th input clock operates, an (m+N)-th signal is input to the No. 0 memory.

The deterioration of performance resulting from the influence of metastability attributable to a clock domain crossing problem that occurs when asynchronous clocks are used can be reduced by increasing the retention time of data through such a process.

Furthermore, the influence of a phase offset generated between asynchronous clocks can be minimized because the location of memory in which signals to be sampled are stored and the resample position of the signals are predicted by calculating the cumulative value of a received resample ratio.

At step S40, the resample position compensation unit 600 corrects the error value of the signals occurring due to the conversion of a non-integer multiple sample rate by applying the value (Dint, dfrac) of the resample position to the signals.

Figure 8:
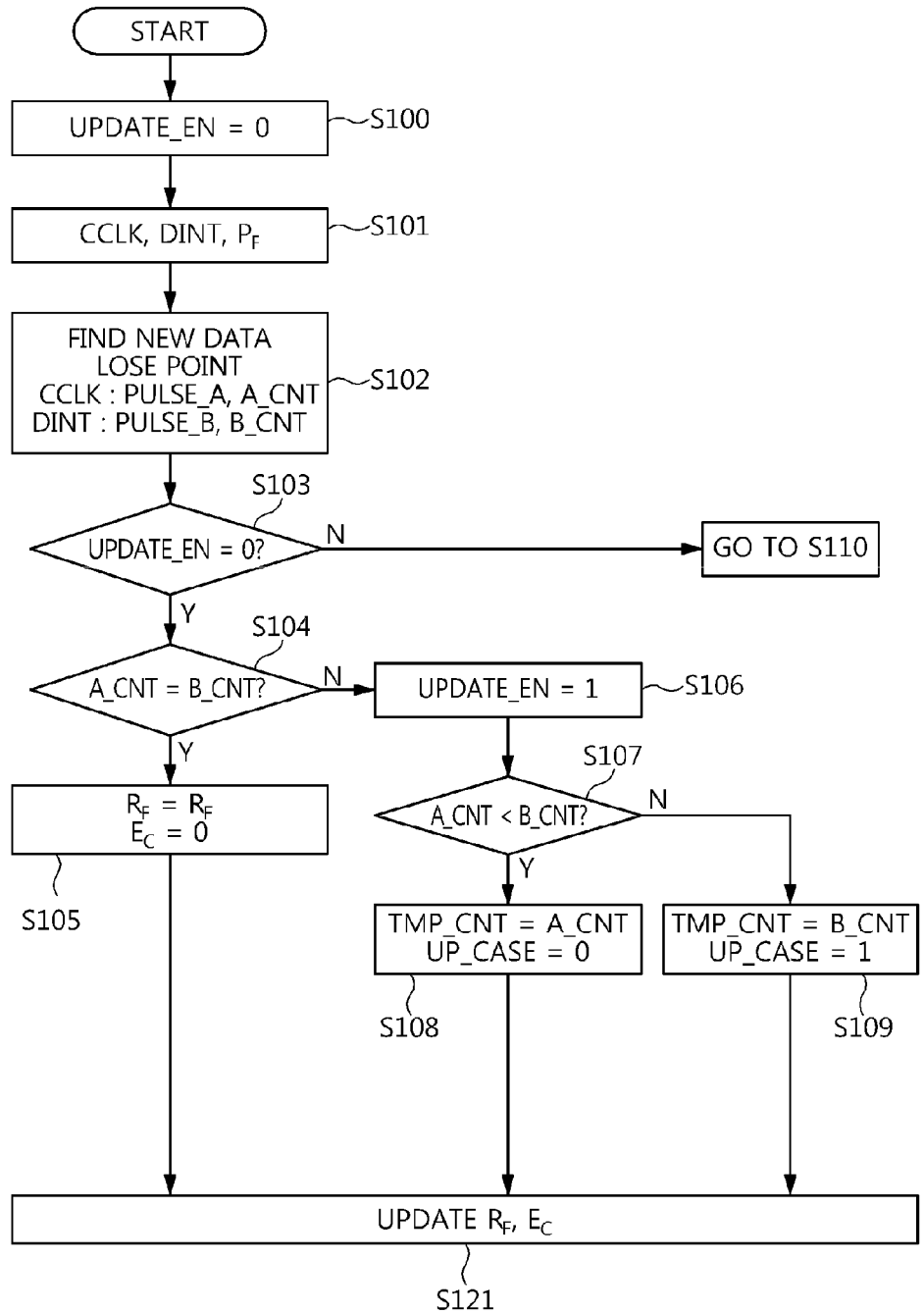
FIGS. 8 and 9 are flowcharts schematically illustrating the operation of the resample ratio error estimation unit according to an embodiment of the present invention.
Figure 9:
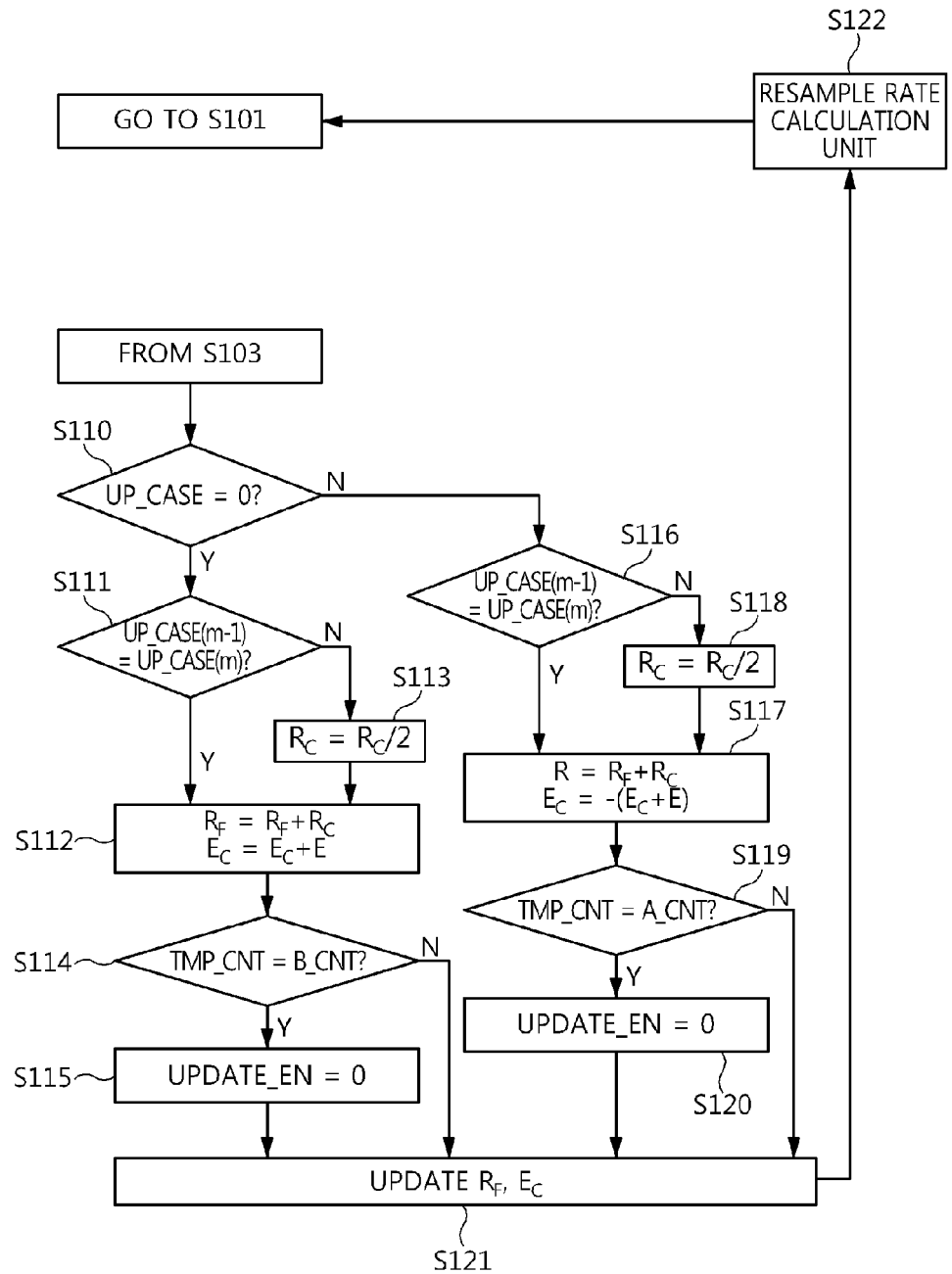

FIGS. 8 and 9 are schematic flowcharts illustrating the operation of the resample ratio error estimation unit according to an embodiment of the present invention.

If the loss point of data generated due to the value Dint is not equal to that of data actually generated between two clocks, the resample ratio error estimation unit 530 determines that an error is present in a received resample ratio, and updates the fractional rate part value of the resample ratio.

The operation of the resample ratio error estimation unit 530 is described below with reference to FIGS. 8 and 9.

In this case, Rf=FracRate_comp, Rc=Comp_Fdelay, and Ec=Error_comp.

Update_EN is a signal that determines whether a current resample ratio has been updated, and the initial value thereof is set to 0 at step S100. Thereafter, when the value Update_EN becomes 1, the resample ratio error estimation unit 530 determines that an error has occurred between an actual clock ratio and a current resample ratio. The resample ratio error estimation unit 530 performs a process of correcting the error at steps S110 to S120.

An error estimation method in an embodiment of the present invention is performed based on whether the loss point of data is generated fast or slow, not based on whether the loss point of the data has occurred. Accordingly, a criterion for determining an error varies depending on whether the value Update_EN is 0 or 1.

The resample ratio error estimation unit 530 determines the value Update_EN at step S103. If, as a result of the determination, the value Update_EN is 0, the resample ratio error estimation unit 530 compares a value A_cnt with a value B_cnt on the assumption that there is no error because the two values have the same loss point at step S104. If the values A_cnt and B_cnt are the same, there is no error between the two values, and thus Ec=0 and Rf=Rc at step S105.

If the values A_cnt and B_cnt are different, the resample ratio error estimation unit 530 performs a process of finding the point of time at which the error has occurred at steps S106 to S109.

If the value Update_EN is 1 (after steps S106 and S110), there is the assumption that points of time at which the loss points of the two values are generated are different. Accordingly, a value at which a loss point was generated is stored as a tmp_cnt, and the value tmp_cnt is compared with the value of a block in which a loss point is generated slow.

The value Update_EN becomes 0 at the point of time at which the two values become the same, and thus the error estimation process is stopped.

While the value Update_EN is 1, a resample ratio is updated for each pulse. If the error of the resample ratio is great, the error of a point of time, at which a loss point is generated, with respect to an actual clock ratio is great due to a cumulative value.

Accordingly, while the value Update_EN is 1, the range of error estimation can be narrowed within a short period of time by updating the resample ratio for each pulse.

In this case, Up_case is a reference value for determining whether the resample ratio is great or small based on the actual clock ratio, and indicates the directivity of the update.

When the point of time at which the value Up_case is changed is reached, the resample ratio error estimation unit 530 may determine that a current error value is smaller than an error correction unit value and correct the current error value into a minimum error value by reducing an error correction unit value by half at steps S113 and S118.

Figure 10:
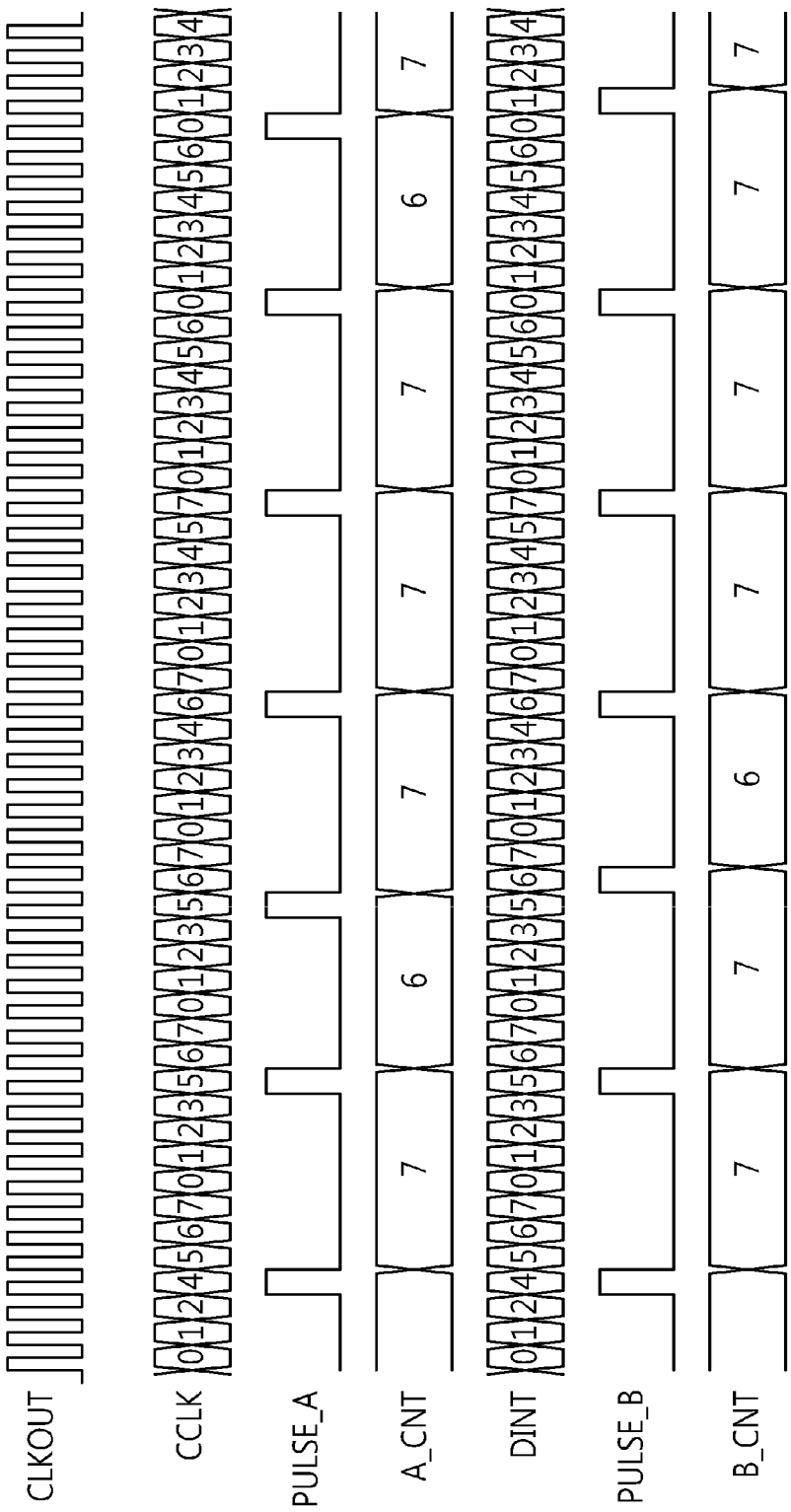
FIGS. 10 and 11 are timing charts illustrating the operation of the resample ratio error estimation unit.
Figure 11:
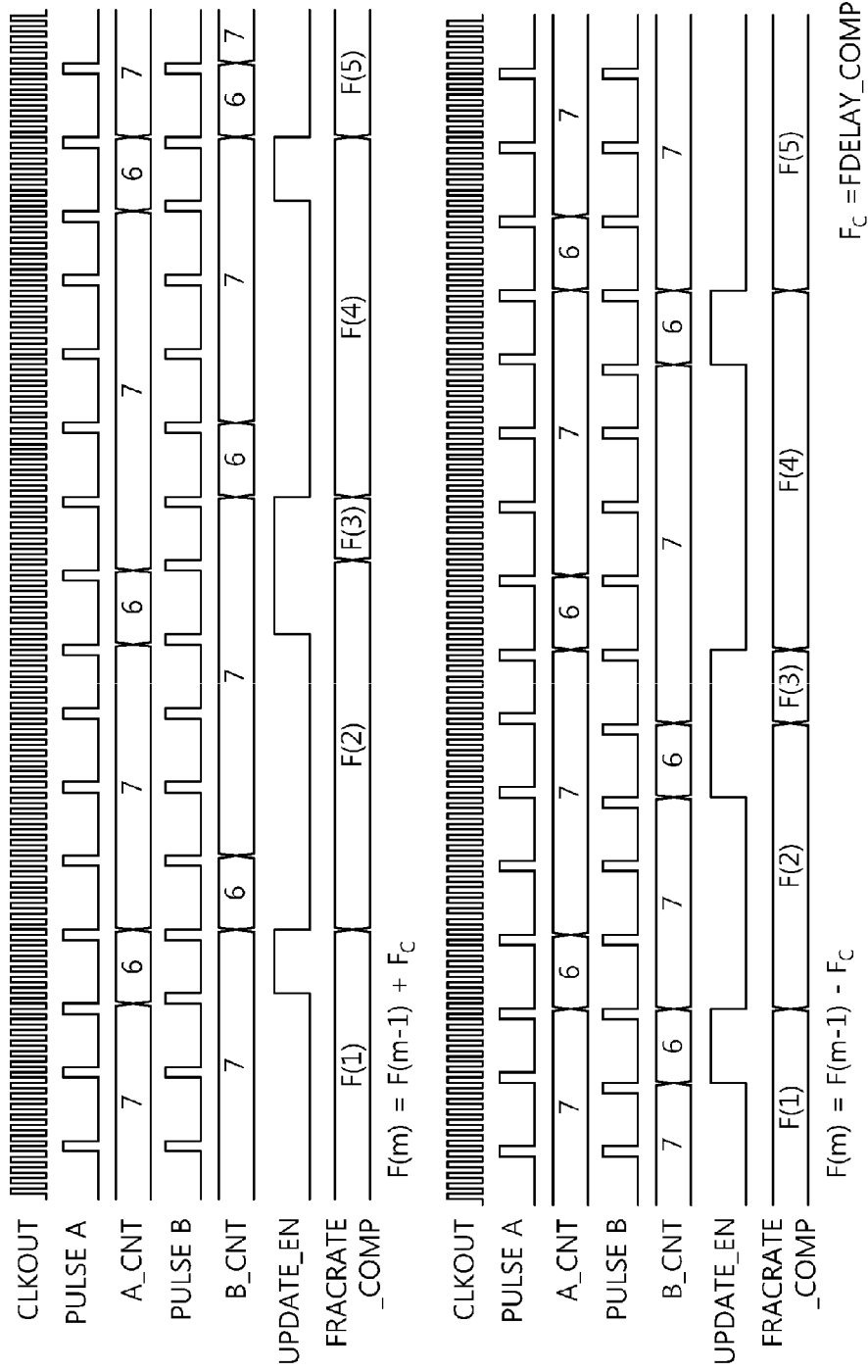

The processes of FIGS. 8 and 9 may be further clearly understood through descriptions of FIGS. 10 and 11.

FIGS. 10 and 11 illustrate the operation of the resample ratio error estimation unit with reference to timing charts.

FIG. 10 is a timing chart illustrating that loss points generated in an actual clock ratio and a resample ratio are found and a pulse is generated.

The pulse values Pulse_A and Pulse_B are generated whenever a loss point is generated in the output value Cclk of the clock count block 531 and Dint, i.e., the integer value of the result value of the accumulator. Values obtained by counting the intervals between the pulses are A_cnt and B_cnt.

FIG. 11 illustrates an example in which a resample ratio smaller than an actual clock ratio is input.

Since a resample ratio smaller than an actual clock ratio is input, a loss point generated due to the cumulative value of a fractional part is generated later than an operation based on the actual clock. From this, it may be seen that the resample ratio currently applied to a resampler operates at a value smaller than that of the actual clock ratio.

FIG. 11 is a timing chart schematically illustrating a method of compensating for a resample ratio using the resample ratio error estimation unit 530.

Update_EN corresponds to a signal that is used to determine whether a current resample ratio has been updated. If the values A_cnt and B_cnt are different, the resample ratio error estimation unit 530 determines that an error is present between the two values, and outputs the value 1.

If the value Update_EN becomes 1, the resample ratio is updated. If the value A_cnt is smaller than the value B_cnt when the value Update_EN is 1, the resample ratio error estimation unit 530 determines that the resample ratio is smaller than an actual clock ratio, and then updates the resample ratio with a value obtained by adding the correction unit value Comp_Fdelay to the resample ratio. If the value A_cnt is larger than the value B_cnt, the resample ratio error estimation unit 530 determines that the resample ratio is higher than the actual clock ratio, and updates the resample ratio with a value obtained by subtracting the correction unit value Comp_Fdelay from the resample ratio.

The first timing chart of FIG. 11 illustrates an example of a process of estimating an error when the value of a resample ratio smaller than an actual clock ratio is received.

When an error occurs in the values A_cnt and B_cnt, the value Update_EN becomes 1 and the value FracRate_comp is updated. If the value A_cnt is smaller than the value B_cnt, the value A_cnt is stored as the value tmp_cnt. Accordingly, the resample ratio error estimation unit 530 determines that a resample ratio is smaller than an actual clock ratio, and updates the resample ratio with a value "FracRate_comp+ Comp_Fdelay." If the value B_cnt is equal to the value tmp_cnt, the value Update_EN becomes 0, and an update process is not performed.

The second timing chart of FIG. 11 illustrates an example of a process of estimating an error when the value of a resample ratio higher than an actual clock ratio is received. In this case, on the contrary, when an error occurs, the value A_cnt is larger than the value B_cnt. Accordingly, the resample ratio error estimation unit 530 determines that the resample ratio is higher than the actual clock ratio, and updates the resample ratio with the value "FracRate_comp-Comp_Fdelay."

Figure 12:
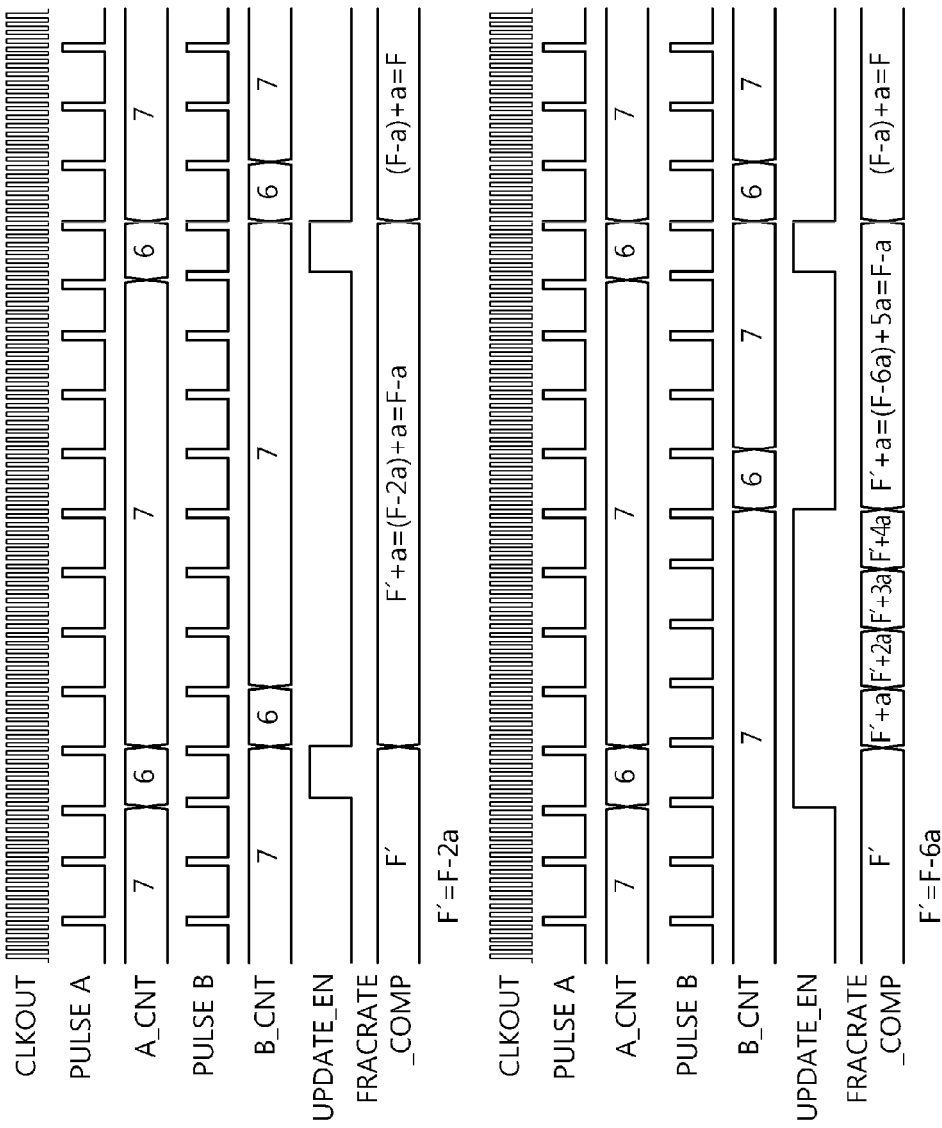
FIG. 12 is a timing chart illustrating a process of updating the value FracRate_comp based on the error size of a resample ratio according to an embodiment of the present invention.

FIG. 12 is a timing chart illustrating a process of updating the value FracRate_comp based on the error size of a resample ratio according to an embodiment of the present invention.

In FIG. 12, a resample ratio F' input at a first clock has the error of 2*a* in comparison with an actual clock ratio.

In the timing chart of a second clock, a resample ratio F' input at the second clock has the error of 6*a* in comparison with an actual clock ratio. A method of estimating the error of a resample ratio is illustrated using the two cases as examples. If an error is small, the difference between the points of times at which loss points in an actual clock ratio and Dint are generated is small, but the time during which the error occurs increases accordingly. In contrast, as an error increases, the interval between the points of times at which loss points in an actual clock ratio and Dint are generated increases due to a cumulative error value. Accordingly, the time for which the value Update_EN is maintained at 1 increases.

In this case, the range of error estimation can be reduced within a short period time by updating the value FracRate_comp for each pulse.

As described above, at least one embodiment of the present invention has an advantage in that it can minimize an influence attributable to a phase offset because the sample rate of a signal is converted using memory, a signal stored in the memory is selected, and a fractional delay value corresponding to the signal is corrected.

Although the specific embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A sample rate converter, comprising:
a data delay unit configured to delay signals in response to an input clock signal;
a clock rate conversion unit comprising a memory, the clock rate conversion unit configured to convert a sample rate of the signals;
a Lagrange polynomial filter unit configured to perform, using a Lagrange polynomial, a filtering function on the signals whose rate has been converted;
a resample position calculation unit configured to output a value of a resample position of the signals based on a set resample ratio value, the value of the resample position comprising an integer value and a factional value; and
a resample position compensation unit configured to:
correct an error value of the signals generated due to non-integer multiple sample rate conversion by applying the value of the resample position to the signals; and
output a final signal;
wherein converting the sample rate of the signals includes (i) storing the signals in the memory, and (ii) sampling, using the integer value of the value of the resample position as a memory address of the memory, the signals stored in the memory, and
wherein the resample position compensation unit includes a resample ratio error estimation unit configured to determine that an error is present in a received resample ratio when a first change point generated according to the integer value of the value of the resample position is not equal to a second change point generated according to the input clock and an output clock.

2. The sample rate converter of claim 1, wherein the clock rate conversion unit sequentially stores the input signals, sampled at an input clock rate, in the memory.

3. The sample rate converter of claim 1, wherein:
an order of a filter of the Lagrange polynomial filter unit is variably applied depending on a resample rate and a bandwidth; and
a coefficient of the filter is determined by the order.

4. The sample rate converter of claim 1, wherein a delay order of the data delay unit is determined by an order of a filter of the Lagrange polynomial filter unit, and the signals are delayed by 1 sample in response to the input clock.

5. The sample rate converter of claim 1, wherein the resample position calculation unit outputs the value of the resample position used to estimate the resample position based on the value of the resample ratio indicative of a ratio of the input clock to an output clock.

6. A sample rate converter comprising:
a data delay unit configured to delay signals in response to an input clock signal;

a clock rate conversion unit configured to convert a sample rate of the signals;

a Lagrange polynomial filter unit configured to perform, using a Lagrange polynomial, a filtering function on the signals whose rate has been converted;

a resample position calculation unit configured to output a value of a resample position of the signals based on a set resample ratio value; and a resample position compensation unit configured to:
correct an error value of the signals generated due to non-integer multiple sample rate conversion by applying the value of the resample position to the signals; and
output a final signal;

wherein the value of the resample position comprises an integer value and a factional value, wherein the resample position calculation unit outputs the value of the resample position used to estimate the resample position based on the value of the resample ratio indicative of a ratio of the input clock to an output clock, and wherein the resample position calculation unit comprises:
a resample ratio error compensation unit configured to:
estimate an error between a received resample ratio and an actual operation clock ratio;
update the resample ratio value; and
compensate for a cumulative error corresponding to the updated resample ratio value; and
a resample rate calculation unit configured to:
receive a value estimated by the resample ratio error compensation unit; and
output the value of the resample position in accordance with an output sample rate.

7. The sample rate converter of claim 6, wherein the resample ratio error compensation unit comprises:
a resample ratio error estimation unit configured to estimate the error between the received resample ratio and the actual operation clock ratio; and
a computation error compensation unit configured to correct the cumulative error value that is generated due to a previous resample ratio value as the resample ratio value is updated.

8. The sample rate converter of claim 7, wherein if a change point of data generated due to the integer value of the value of the resample position is not equal to a change point of data generated between actual clocks, the resample ratio error estimation unit determines that an error is present in a received resample ratio, and updates a value of a factional ratio part of the resample ratio.

9. The sample rate converter of claim 7, wherein the resample ratio error estimation unit comprises:
a clock count block configured to output a signal, counted using the input clock, as a counted output clock signal;
computation and pulse generation blocks configured to:
determine a first difference of a first value of the counted output clock signal corresponding to a current clock cycle and a second value of the counted output clock signal corresponding to a previous clock cycle;
generate a first pulse according to whether the first difference is equal to a redetermined value set in accordance with the resample ratio;
determine a second difference of respective integer values of a first value of the resample position corresponding to the current clock cycle and a second value of a resample position corresponding to the previous clock cycle; and
generate a second pulse according to whether the second difference is equal to the predetermined value set in accordance with the resample ratio;
first and second pulse count blocks configured to calculate a pulse occurrence interval of the first and second pulses, respectively;
a comparison block configured to:
compare the first pulse with the second pulse, using the first and second pulses and the outputs of the first and second pulse count blocks; and
determine an operating rate of the integer value of the received value of the resample position; and
an update block configured to:
receive an operating state of the integer value of the value of the resample position; and
output a value FracRate_comp obtained by updating the resample ratio value with a correction unit value Comp_Fdelay.

10. The sample rate converter of claim 9, wherein the computation error compensation unit comprises:
a counter unit configured to output a count value of a section, calculated using a previous ratio, whenever the value FracRate_comp obtained by updating the resample ratio value with the correction unit value Comp_Fdelay is updated; and
an accumulation unit configured to calculate an error compensation value of the section, calculated using the previous ratio, using the value, output by the counter unit, and the correction unit value Comp_Fdelay.

11. A method of converting a sample rate, comprising:
sequentially storing input signals, sampled at an input clock rate, in a memory of a clock rate conversion unit;
outputting, by a resample position calculation unit, a value of a resample position of the signals based on a set resample ratio value, the value of the resample position comprising an integer value and a fractional value;
sampling, by the clock rate conversion unit, the signals stored in the memory, the sampling being performed at an output clock rate and using an integer value of the resample position as an address of the memory; and
correcting, by a resample position compensation unit, an error value of the signals attributable to non-integer multiple sample rate conversion by applying the value of the resample position to the signals,
wherein correcting, by the resample position compensation unit, the error value of the signal attributable to the non-integer multiple sample rate conversion by applying the value of the resample position to the signal comprises minimizing an influence of a phase offset generated between asynchronous clocks by predicting a location of the memory in which the signals to be sampled are stored and a resample position of the signal through calculation of a cumulative value of a received resample ratio.

12. The method of claim 11, wherein the value of the resample position comprises the integer value corresponding to an integer part and a factional value corresponding to a fractional part.

13. The method of claim 11, wherein sampling, by the clock rate conversion unit, the signals stored in the corresponding memory at the output clock rate by using the integer value of the resample position as the address of the corresponding memory comprises:
sequentially storing, by the clock rate conversion unit, the input signals, sampled at the input clock rate, in the memory; and sampling the signals, stored in the corresponding memory, at the output clock rate by using an integer value of the resample position calculated by the resample position calculation unit as the address of the corresponding memory address.

* * * * *